United States Patent [19]
Logue

[11] 3,914,760

[45] Oct. 21, 1975

[54] ACCURATE AND STABLE ENCODING WITH LOW COST CIRCUIT ELEMENTS

[75] Inventor: Joseph C. Logue, Poughkeepsie, N.Y.

[73] Assignee: International Business Machines Corporation, Armonk, N.Y.

[22] Filed: Dec. 20, 1972

[21] Appl. No.: 316,789

[52] U.S. Cl...... 340/347 AD; 340/347 CC; 328/155; 331/25

[51] Int. Cl.² .......................................... H03K 13/02

[58] Field of Search .............. 340/347 AD, 347 NT, 340/347 SY, 347 CC; 331/14, 25; 328/155; 325/419, 420, 421; 329/122

[56] References Cited

UNITED STATES PATENTS

| | | | |
|---|---|---|---|
| 2,930,033 | 3/1960 | Webb | 340/347 SY |
| 2,991,462 | 7/1961 | Hose | 340/347 SY |
| 3,357,012 | 12/1967 | Brook | 340/347 SY |
| 3,505,669 | 4/1970 | Welch | 340/347 SY |
| 3,534,285 | 10/1970 | Kobold et al. | 331/14 X |
| 3,564,425 | 2/1971 | Brok | 328/155 X |
| 3,665,305 | 5/1972 | Petrohilos | 340/347 AD |
| 3,753,114 | 8/1973 | Burley | 331/25 X |
| 3,753,141 | 8/1973 | Van Elk et al. | 331/25 X |

*Primary Examiner*—Thomas J. Sloyan
*Attorney, Agent, or Firm*—Robert Lieber

[57] ABSTRACT

This accurate and stable analog to digital conversion system and circuits useful therewith is based upon selective counting of high frequency electrical signal oscillations generated by a phase locked frequency multiplication network. The network contains only low cost components. Accuracy and stability derive from maintenance of predetermined phase locked relationship between the signal derived through frequency division of the network output signal and a cyclic reference signal which is also the reference for gating the encoding counts (i.e. the reference for measurement of the analog parameter which is to be encoded). The network output frequency is a harmonic of the frequency of the reference signal. Feedback phase control is developed through interaction of the frequency divided network output with the reference signal in a phase comparator circuit. A novel circuit arrangement for generating the reference signal in the form of ramp oscillations is also disclosed.

3 Claims, 6 Drawing Figures

ACCURATE AND STABLE ENCODING WITH LOW COST CIRCUIT ELEMENTS

FIELD OF THE INVENTION

The invention relates to digital type measurements of scalar quantities such as angle, position, time, voltage, etc., and to large scale integration (LSI) circuit configurations especially suited thereto. The invention also concerns a circuit arrangement for generating bipolar ramp oscillations with controllable slope and frequency.

DESCRIPTION OF THE PRIOR ART

For many analog to digital conversion applications a requirement exists to be able to accurately count high frequency clock signals during precisely defined time intervals corresponding to the analog quantity to be encoded. U.S. Pat. Nos. 3,261,007 (Frish), 3,500,449 (Lenz) and 3,634,838 (Granqvist) are believed to exemplify prior art conversion arrangements wherein the clocking signals are generated electronically by uncontrolled oscillator circuits, usually crystal controlled and therefor expensive, which operate essentially independently of the source of the signals which represent the reference or start condition for beginning encoding (counting). A problem with this type of circuit arrangement is that its accuracy is limited by oscillator drift or "jitter" either relative to or together with the start reference condition.

"Electronic Design" Apr. 7, 1972, pages 23 and 24 describes a more stable and potentially more accurate type of conversion apparatus in a compass device. Here a continuously rotating expensively constructed patterned disc communicates with rather expensive stationary pattern detection apparatus to provide the clocking pulses for the encoder counting operation. This disc couples mechanically to a rotating shaft which communicates with sources of start and stop marking signals defining the counting time limits. The start signal is a sinusoid derived by Hall-effect from the Earth's magnetic field and transferred to the counting controls via slip rings. The stop signal is derived photoelectrically. For precision encoding applications, this type of apparatus requires highly accurate and reliable construction of the patterned disc, slip rings and reduction gears, all of which can be quite difficult to fabricate and costly.

My invention seeks to overcome the cost disadvantages of the prior art crystal oscillator clocking arrangements, as well as the cost and mechanical limitations of the patterned disc clocking arrangement, through extensive use of integrally packageable electronics, while retaining the stability and accuracy qualities of the disc arrangement in respect to maintenance of fixed phase relationship between the clocking signals and the start marking condition. By developing the basic clock oscillations for the counting stage of the subject encoder from a phase locked oscillator controlled by the start marking reference the circuit of my invention, in one embodiment thereof, is useful as a low cost electronic substitute for the patterned disc and associated detection elements in the above-referenced compass device, with comparable or even superior accuracy, precision and insensitivity to jitter error.

SUMMARY OF THE INVENTION

A voltage controlled oscillator (VCO) and frequency dividing feedback circuit, connected in a phase locked loop locked to the start marking reference, serve as a low cost electronic substitute for the patterned disc and associated pattern detection elements (light, photocell) of the compass device referenced above. Means are also disclosed for eliminating the slip rings of the Hall signal generation unit of the device. Other encoding circuit configurations and applications are described.

The frequency of the square wave oscillations produced by the VCO circuit is a predetermined high order harmonic of the basic recurrence frequency of the start marking reference. By virtue of the phase locked relationship the frequency of the VCO output is maintainable in predetermined harmonic relationship to the start marking reference signal. The output of the VCO, between start and stop marking time instants which represent the analog parameter to be encoded (i.e. angle, time, voltage, displacement, etc.), is counted by a digital counter. The state of the digital counter at stop time is an encoded representation of the analog parameter.

The counting circuits are preferably arranged to count in binary coded decimal (bcd) digit units in order to provide a multi-digit representation of the analog input function, which can then be directly translated into signals for operating integrally packaged light emitting diode circuit matrices providing visual display indications of corresponding decimal digits in ordinary readable form. Thus, all or at least a major portion of the subject conversion and display apparatus can be compactly packaged in low cost LSI modules.

In an alternate embodiment particularly suited for application to digital voltmeter apparatus the reference signal for controlling the VCO circuit of the subject invention is developed by a novel ramp oscillator circuit providing bipolar ramp oscillations having alternating positive and negative slope segments. The encoded representation is obtained by combining partial counts developed during portions of successive ramp segments. This eliminates potential inaccuracies expected from the use of low cost components in the ramp generator circuit and from differences between the components associated discretely with the negative and positive ramp segments. It also simplifies the circuitry required for controlling the encoding count operations.

Objects of the present invention include provision of a low cost digital encoder having high accuracy, precision and stability. A corollary objective is the provision of a circuit for converting an analog parameter into a finite pulse train containing a number of pulses corresponding precisely to the measurement of the parameter. Another object is to provide a circuit for generating bipolar ramp oscillations and application thereof in encoding apparatus.

The foregoing and other features and objects of my invention will be appreciated by considering the following detailed description thereof in association with the accompanying drawings.

DETAILED DESCRIPTION

Figure 1:
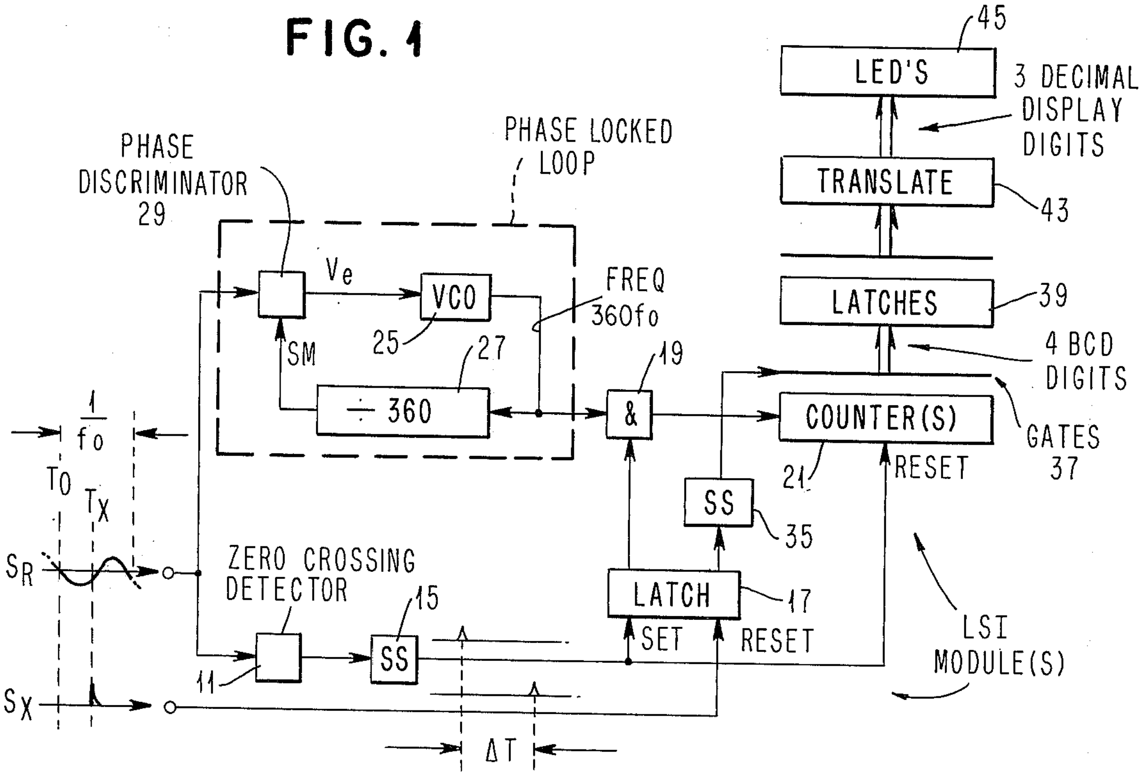
FIG. 1 is a schematic of integrated circuit conversion and display apparatus in accordance with the invention.

FIG. 1 indicates electronic circuit apparatus in accordance with one preferred embodiment of the invention. The quantity to be encoded is the phase of the variable phase cyclic pulse signal $S_X$ relative to the sinusoidal reference signal $S_R$. The variable and reference signals are periodically recurrent at the same frequency. The zero crossing of the reference signal $S_R$, detected by zero crossing detection circuit 11, operates pulse single shot circuit 15 to transfer setting excitation to latch circuit 17. In SET condition circuit 17 enables AND circuit 19 to admit counting pulses to digital counter 21. Counter 21 may be reset to a reference (e.g. zero) count state at the same time that latch 17 is set.

The leading edge of $S_X$, which marks the end of the variable interval to be encoded, is utilized to reset latch 17 and thereby terminate the admission of counts to counter 21. The counting pulses produced by a low cost voltage controlled square wave oscillator 25 (VCO) are periodically recurrent at a frequency which is a harmonic of the frequency of the reference signal $S_R$. In the illustration, the $360^{th}$ harmonic is suggested as exemplary but by no means limiting.

The VCO output is processed in a feedback loop including frequency divider 27 (counter), serving to divide the frequency of the output by the harmonic factor (e.g. by 360), and phase discrimination circuit 29 supplying controlling input voltage to the VCO. Circuit 29 samples discrete portions of the reference signal $S_R$ under control of output SM ("modulation signal") of divider 27. The samples are filtered to provide error voltage $V_e$, the magnitude of which depends upon the phase difference between $S_R$ and SM. Error voltage $V_e$ is applied to the VCO, completing a phase locked loop. Thus with the loop completed, the output of divider 27 is locked in predetermined phase relationship with the reference signal $S_R$ imposing a predetermined frequency constraint on the VCO output. Consequently, with the VCO output frequency equal to 360 times the frequency of the reference signal $S_R$, the count acquired by counter 21, between time intervals marked by successive zero crossings of $S_R$ and leading edges of $S_X$, will not be subject to uncertainty arising from oscillator drift or jitter as normally associated with open loop or even crystal controlled oscillations. The count acquired by counter 21 thereby accurately represents the phase difference between $S_R$ and $S_X$.

The circuit formed by VCO 25, divider 27 and discriminator 29 is a well known configuration ordinarily used for frequency multiplication. Its application herein for encoding time base generation is believed to be novel.

Resetting of latch 17 by $S_X$ terminates the input to counter 21 and causes single shot 35 to produce a pulse which enables a plurality of gates, represented schematically at 37, to transfer the output of counter 21 in parallel into corresponding storage latches 39 (i.e. register) which store the count; preferably in binary coded decimal (bcd) form. Latches 39 may be indirectly coupled, via translation networks 43, to light emitting diode (LED) arrays 45. Networks 43 translate the bcd representations of latches 39 into signal configurations appropriate for operating the LED arrays to produce corresponding decimal digit display indications. The LED's and latches 39 are preferably configured to provide a plural digit display indication; illustratively three significant figures as suggested in FIG. 1 although more or less significant figures may be provided.

For integrated circuit packaging, it is desirable to arrange the light-emitting diodes, latches 39, translating network 43 and counter 21 in decimal digit modules. Consequently, it is also desirable to arrange counter 21 to count in binary coded decimal notation.

In operation, the phase locked frequency multiplication loop formed by square wave oscillator 25, divider 27 and phase discriminator circuit 29, generates high frequency square wave clock oscillations maintained in predetermined relation to the phase of $S_R$. Gate 19 which is enabled for predetermined intervals of time marked by $S_R$ and $S_X$ admits these oscillations to counter 21 to produce count states which at stop time accurately and precisely represent the relative phase difference between the zero crossing of $S_R$ and the variable heading represented by $S_X$. Since the frequency of the clock oscillations is a fixed multiple of the frequency of $S_X$ and $S_R$, it will be appreciated that the heading count accumulated in the counter in each counting interval will not be sujbect to error attributable to instability in the source of oscillations. It will be understood further that when counter 21, gates 37, latches 39, translating network 43 and light-emitting diodes 45 are packaged in modular decimal digit groupings, the entire counting and display network may be efficiently packaged in LSI modules.

Figure 2:
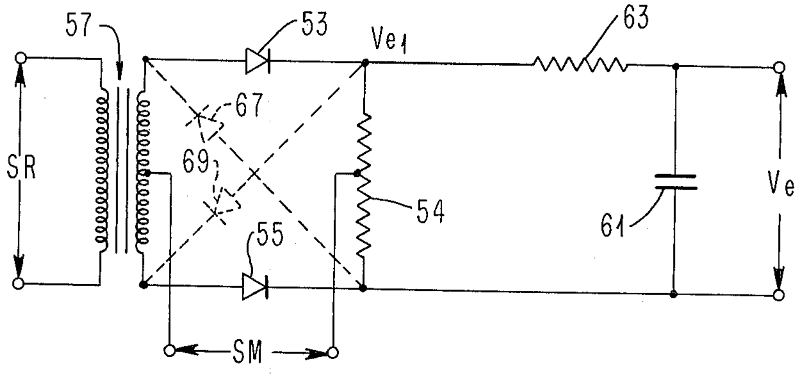
FIG. 2 is a schematic of the phase comparator circuit shown in block form in FIG. 1.

FIG. 2 indicates that phase discriminator circuit 29 may be an ordinary diode phase detector circuit. In this example, the reference signal $S_R$ is inductively coupled across the circuit consisting of diode 53, resistor 54 and diode 55. The modulating signal SM obtained by frequency division of the VCO output square wave clock oscillations is coupled between center-taps of resistor 54 and the secondary of transformer 57. The voltage developed across resistor 54 is applied to low pass filter consisting of capacitor 61 and resistor 63 enabling the capacitor to accumulate error voltage ($V_e$) at a rate dependent upon the form of the signals transferred through the switch circuit formed by the diodes and the RC time constant of the resistor/capacitor circuit 63/61.

Figure 3:
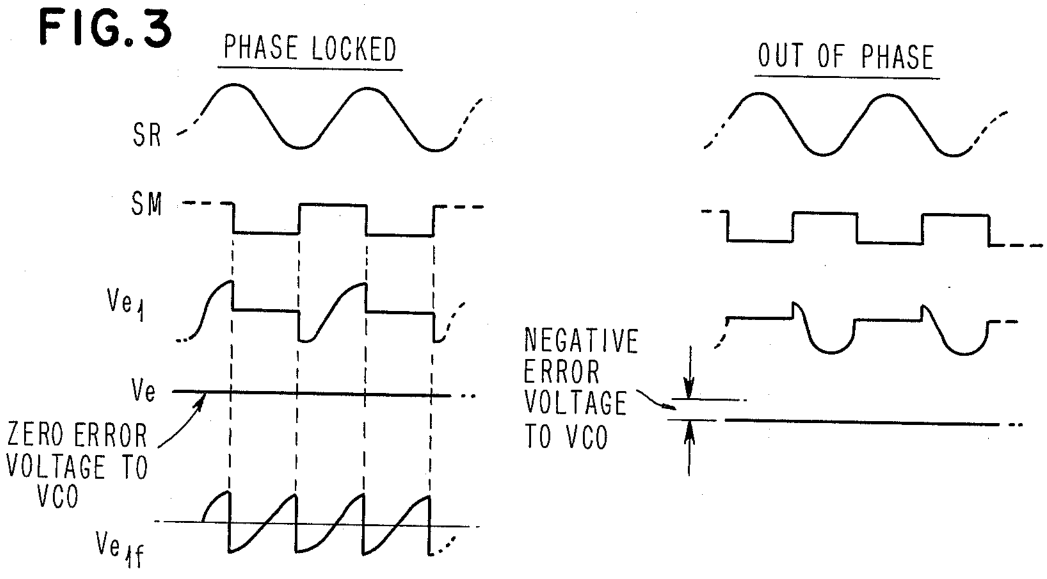
FIG. 3 is a waveform diagram providing a comparison of signals handled by the circuits of FIGS. 1 and 2.

FIG. 3 illustrates that when SM is in "locked" (i.e. 90°) phase relationship to the zero crossing phase of $S_R$, the error voltage $V_{E1}$ received by the RC network contains approximately equal positive and negative power content, resulting in zero net charge accumulation on capacitor 61. In the "out-of-phase" condition, however, FIG. 3 illustrates that unequal increments of positive and negative charge are received by capacitor 61; negative charge predominance particularly illustrated. Thus, a non-zero (e.g. negative) error voltage $V_e$ is developed.

It will be appreciated that when signals $S_R$ and SM have out-of-phase relationship, the error voltage $V_e$ developed on capacitor 61 will have polarity and magnitude tending to drive VCO 25 convergently to the desired stable phase locked condition.

Additional diodes 67, 69 may be provided as shown in phantom in FIG. 2 to provide for full cycle sampling of $S_R$ and consequent more finely resolved development of the error voltage $V_e$. In this case, the stable state error voltage would have the form $V_{ef}$ suggested in FIG. 3.

While we have described a particular embodiment of a phase detector, it is clear that other forms are possible. In particular, all of the elements shown in the box marked phase locked loop of FIG. 1 with the exception of counter 27 are available commercially on a single silicon chip mounted in a module.

Figure 4:
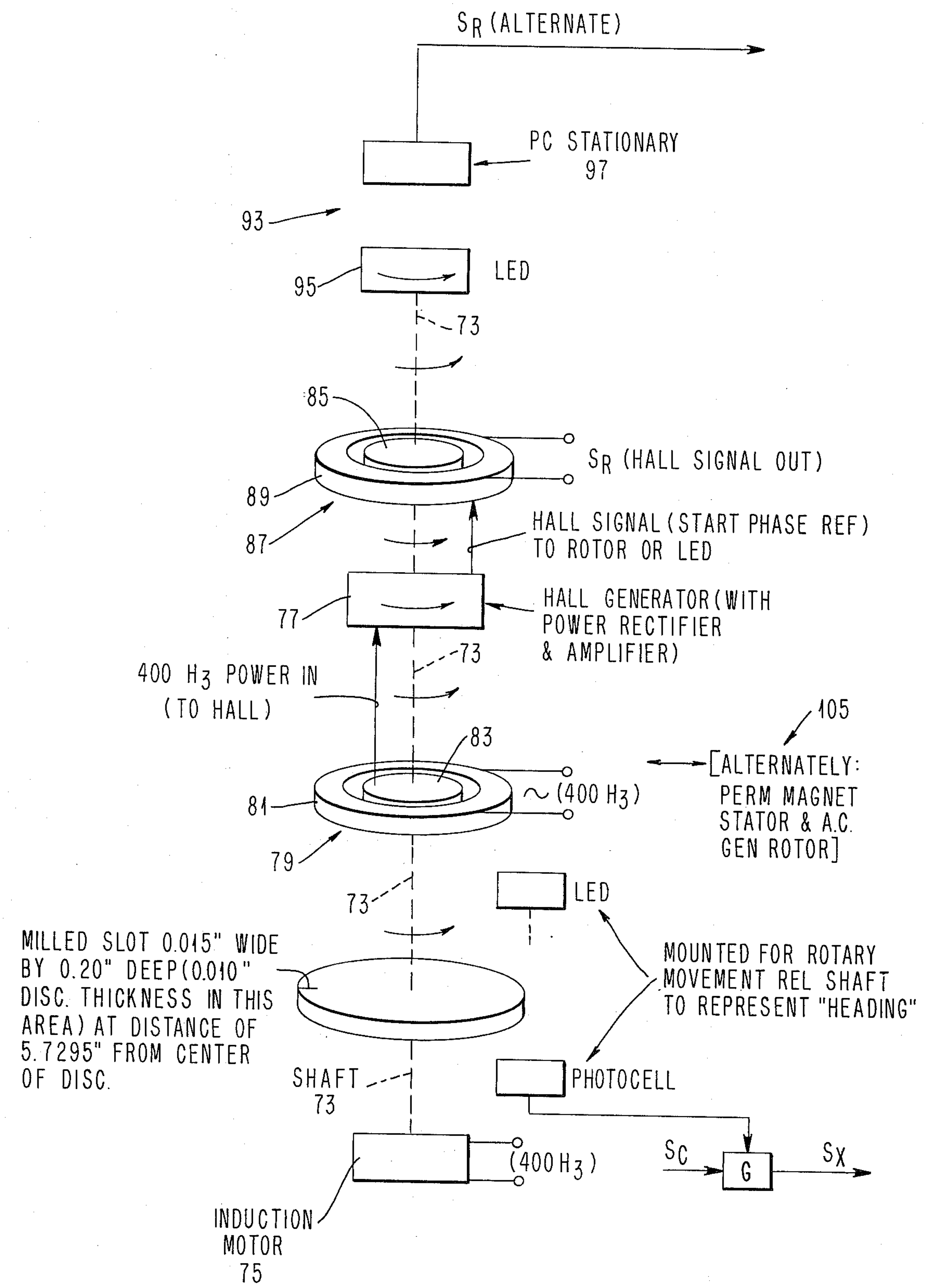
FIG. 4 illustrates sources of start and stop marking signals suitable for input to the circuit apparatus of FIG. 1 in a magnetic compass device.

FIG. 4 indicates an arrangement for developing the reference and variable time marking signals $S_R$ and $S_X$ of FIG. 1 in a magnetic compass device. The illustrated arrangement is intended for direct comparison to the prior art device described in the Electronic Design article cited above. It will be noted that the slip rings, patterned clocking disc and associated photodetection elements of the reference are eliminated by the illustrated arrangement.

Shaft 73 is driven with constant rotational velocity by induction motor 75. Hall signal generator 77 receives 400 Hz power input through toroidal transformer configuration 79 having stator winding 81 and rotor winding 83. Stator 81 is coupled to the 400 Hz power source of induction motor 75. Rotor winding 83, rotating with shaft 73, couples 400 Hz excitation directly to power supply circuits within Hall generator 77.

The output sinusoidal signal, developed by Hall generator 77 through its not shown flux concentrators (refer to the Electronic Design reference above), is amplified and coupled electrically to the rotor winding 85 of a second toroidal transformer assembly 87. This rotor also rotates with shaft 73 and its associated stator 89 is connected to deliver the reference signal $S_R$ directly to the circuit shown in FIG. 1.

An alternate arrangement for developing the reference signal $S_R$, useful in place of transformer configuration 87, is shown in FIG. 4 at 93. In this configuration, a single light-emitting diode 95 mounted axially at the end of shaft 73 communicates with photocell 97. Diode 95 would be energized to produce cyclically fluctuating light emissions by not shown electrical connection with the Hall signal output of generator 77 causing photocell 97 to generate a cyclic signal. Since signal $S_R$ need not be a sine wave and may in fact be a square wave diode 95 may be driven by a square wave signal derived from the Hall signal and output of photocell 97 may be directly coupled to the encoding circuits (FIG. 1).

Alternate arrangement for transferring power to Hall generator 77 in place of the toroidal transformer assembly 79, is suggested at 105 in FIG. 4. The rotor of this arrangement may be an AC generator and the stator of the same arrangement would be arranged to include a permanent magnet from which the rotor windings could develop the desired AC power signal to drive Hall generator 77.

Figure 5:
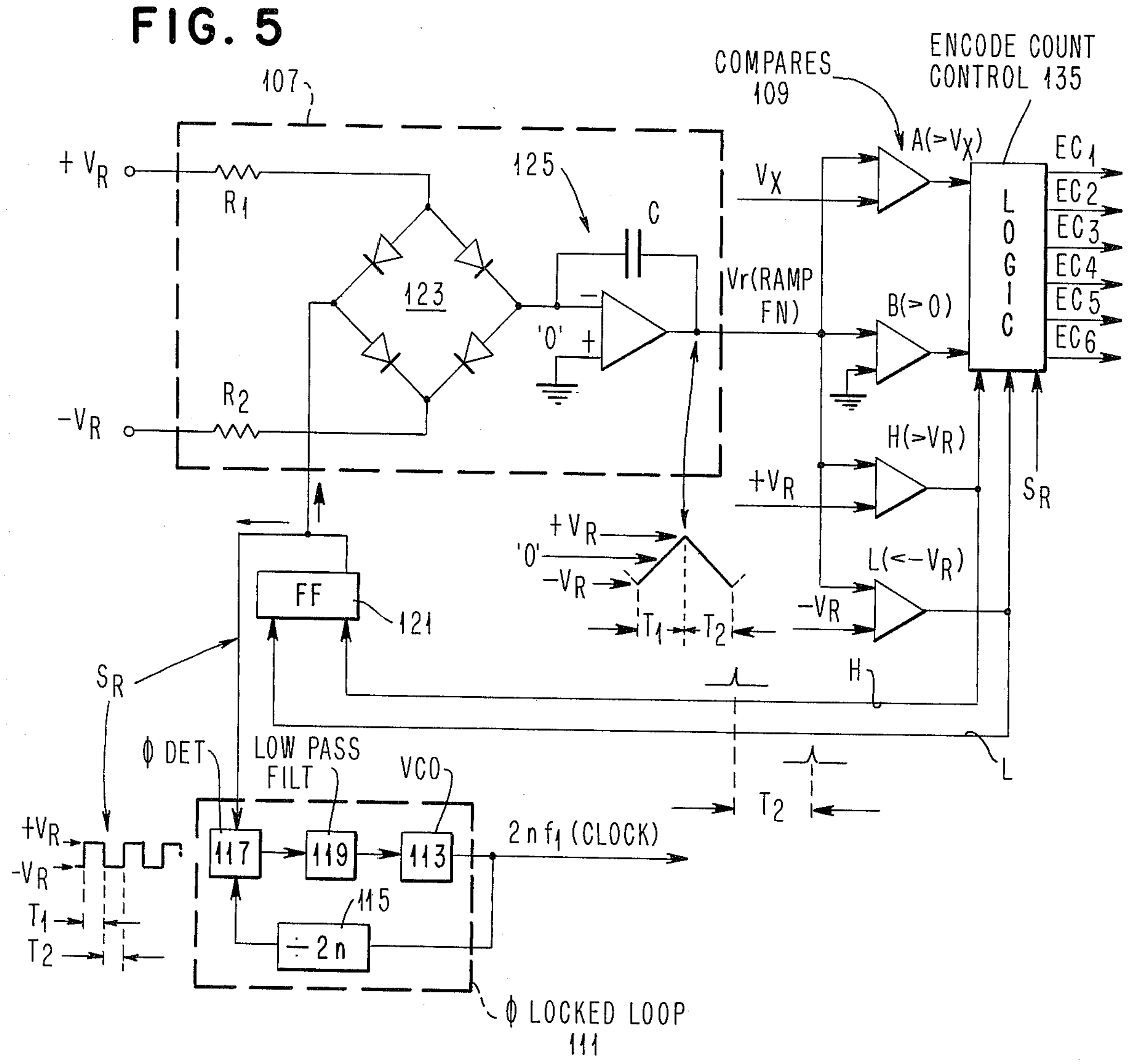
FIG. 5 illustrates an alternate preferred embodiment of the invention especially suited for application to a voltage encoder (e.g. in digital voltmeter apparatus).

FIG. 5 illustrates an alternate preferred embodiment of the subject invention which is especially useful to encode voltage; specifically variable voltage $V_X$ measurable with respect to a reference voltage $V_R$. Oscillator circuit 107 produces cyclic ramp function $V_r$ which is compared to the unknown voltage $V_X$ and three known voltage levels + $V_R$, 0 (ground) and $-V_R$ in threshold comparator circuits 109 having, as output, binary pulse functions A, B, H, L, having the following significance:

A-positive (true) only when $V_r$ exceeds $V_X$
B-positive (true) only when $V_r$ exceeds 0
H-positive (true) only when $V_r$ exceeds $V_R$
L-positive (true) only when $V_r$ is less than $-V_R$ Phase locked loop 111 — consisting of VCO 113, feedback divider (counter) 115, phase detector 117 and low pass filter 119 — generates high frequency square wave clock oscillations at frequency 2 $nf_1$ bearing harmonic relation to the frequency $f_1$ of reference signal $S_R$ supplied to the signal input of detector 117. Signal $S_R$ is a square wave ranging between, as an example, plus and minus one volt.

Signal $S_R$ is produced at Set phase output of gated flip flop circuit (FF) 121 controlled by the positive phases of signals H and L. FF 121 is reset with the positive phases of H, and set with the positive phase of L. Since $S_R$ also controls the diode gate section 123 of ramp generator 107 it is seen that operational integrator section 125 of ramp generator 107 alternately receives input voltages $V_R$ and $-V_R$ as FF 121 is respectively set and reset.

It is seen that FF 121, ramp generator 107 and the comparator circuits generating signals H and L are connected in a closed loop. Thus when FF 121 is set, $-V_R$ is connected to input of integrator 125 and integrated at a rate determined by the product of resistance $R_1$ and capacitance C to provide linearly rising output at $V_r$. As $V_r$ exceeds $+V_R$ signal H is switched to positive phase resetting FF 121 and causing gate 123 to couple $+V_R$ to the input of integrator 125. This is integrated at a rate determined by $R_2$ and C changing $V_r$ to a negative ramp and restoring H to negative phase.

Then as $V_r$ passes below $-V_R$ signal L switches positive setting FF 121. This operates gate 123 to again couple $-V_R$ to integrator 125 reversing $V_r$ slope from negative to positive and restoring L to negative phase. Thus output $V_r$ of circuit 107 oscillates cyclically between positive and negative slope (ramp) conditions. The binary pulse signals A, B, H, L and $S_R$ are processed by logic circuits 135 having six mutually exclusive binary output gating functions $EC_1 - EC_6$ which are used as encoding control signals. Functions $EC_1 - EC_6$ are derived logically and utilized as follows:

| | |
|---|---|
| $EC_1 = \bar{A}.\bar{B}.S_R$ | allows gating of encode counter to display register during end of negative slope phase of $V_r$ |
| $EC_2 = \bar{A}.\bar{B}.\bar{S}_R$ | allows resetting of encode counter at start of positive slope phase of $V_r$ |
| $EC_3 = A \veebar B = \bar{A}.B + A.\bar{B}$ | allows transfer of clock to increment input of encode counter |
| $EC_4 = A.\bar{B}.\bar{S}_R$ | allows setting of encode count sign to − (minus) condition when $V_r$ exceeds unknown $V_X$ and is less than 0 |
| $EC_5 = \bar{A}.B.\bar{S}_R$ | allows setting of + encode count sign when $V_r$ exceeds 0 and is less than $V_X$ |
| $EC_6 = A.L + \bar{A}.H$ | indicates out of range condition ($V_r$ less than $V_X$ at highest level or greater than $V_X$ at lowest level; requiring adjustment of precision voltage divider, in circuit of $V_X$, associated with the decimal point position of the encoded representation of $V_X$). |

Figure 6:
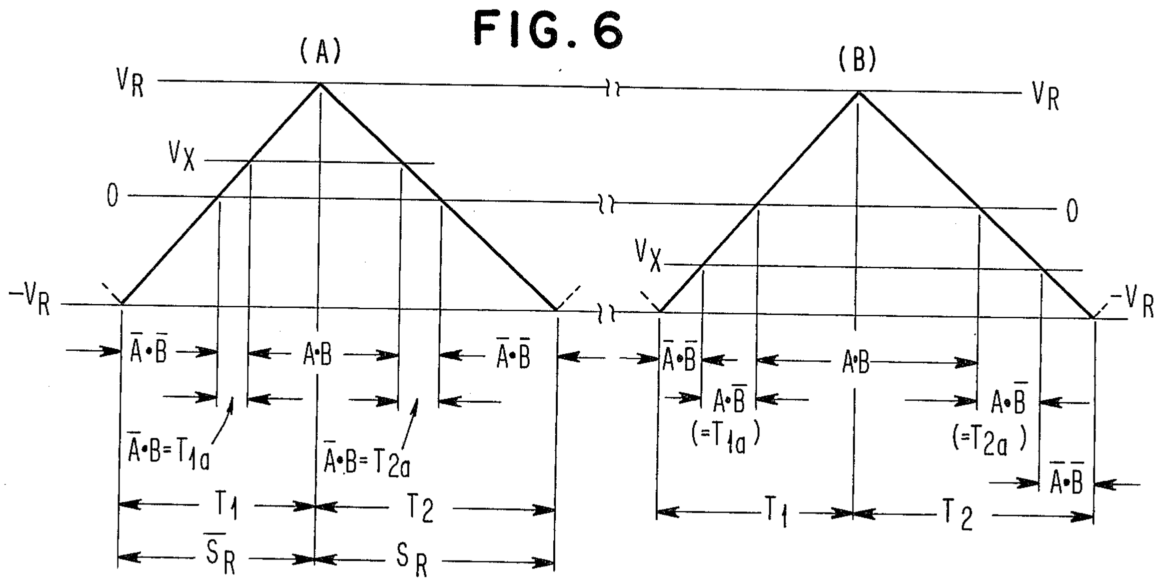
FIG. 6 contains a waveform diagram useful to explain the operation of the circuit of FIG. 5.

FIG. 6 indicates the form and timing of $V_r$. It can be shown with reference to this figure that the encoded count N is developable independently of differences between resistances $R_1$ and $R_2$. The explanation is as follows:

1) frequency of ramp function $(f_1) = \frac{1}{T_1+T_2}$ 2) frequency of clock function $(2nf_1) = \frac{2n}{T_1+T_2}$ 3) $V_r(t) = -V_R + \frac{1}{R_1C}\int_0^t V_R\,dt = -V_R + \frac{V_R}{R_1C}t$
(where $0 \leq t \leq T_1$)

3a) at $t = T_1$, $V_r = V_R$; hence $V_R = -V_R + \frac{V_R}{R_1C}T_1$ 3b) whence $T_1 = 2R_1C$ 4) $V_r(t) = +V_R + \frac{1}{R_2C}\int_0^t -V_R\,dt = +V_R - \frac{V_R}{R_2C}t$
(where $T_1 \leq t \leq T_2$)

4a) at $t = T_2$, $V_r = -V_R$; hence $-V_R = V_R - \frac{V_R}{R_2C}\cdot T_2$ 4b) whence $T_2 = 2\,R_2C$ 5) from 2, 3*b* and 4*b* we have frequency of clock
$$= \frac{2n}{T_1+T_2} = \frac{n}{(R_1+R_2)C}$$

6) The encoded count $N$ developed during $T_1 + T_2$ is then given by: $N = n/(R_1+R_2)C\ (t_c)$ where $t_c$ is the total time interval over which counts are admitted to the encode counter 6a) Therefore, referring to FIG. 6, we have:
$$N = \frac{n(T_{1a}+T_{2a})}{(R_1+R_2)C}$$

7) But from 3*b* above and FIG. 6, we have slope
$$\frac{V_X}{T_{1a}} = \frac{2V_R}{T_1} = \frac{2V_R}{2R_1C} = \frac{V_R}{R_1C}$$

7a) whence $T_{1a} = \frac{R_1CV_X}{V_R}$

8) And from 4*b* above and FIG. 6 we also have slope
$$\frac{V_X}{T_{2a}} = \frac{2V_R}{T_2} = \frac{V_R}{R_2C}$$

8a) whence $T_{2a} = \frac{R_2CV_X}{V_R}$

9) Therefore 6*a* above becomes:
$$N = \frac{n\left(\frac{C}{V_R}\right)(R_1+R_2)V_X}{C(R_1+R_2)} = \frac{n}{V_R}\cdot V_X$$

10) Since $n/V_R$ is constant we see that $N$ is a constant times $V_X$; independent of differences between $R_1$ and $R_2$ and therefore independent of component precision.

Thus, it is clear that low cost, low precision components may be used throughout in the circuit of FIG. 5 without degrading encoding accuracy.

In operation (referring to FIGS. 5 and 6) when $V_X$ is positive (refer to diagram A, FIG. 6), as the positive slope ramp $V_r$ (i.e. the ramp condition while $S_R$ is at false or −one volt level) passes the 0 level, conditions A and B are respectively not true and true ($\overline{A}.B$) so the encode counter counts up (see $EC_3$ above) from initial reset count state established earlier during $A.B.\overline{S}_R$ (see $EC_2$ above). As the ramp passes through level $V_X$, A becomes true and the count stops. Thus the partial count of $T_{1a}$ is now held in the counter. During the succeeding negative slope phase as $V_r$ passes $V_X$ negative-wise (at start of $T_{2a}$) condition $\overline{A}.B$ again becomes true and the positive slope count is augmented until $V_r = 0$ (at end of $T_{2a}$). The accumulated count now contained in the encode counter is a function of 2n (the clock harmonic factor), $V_R$ and $V_X$ (i.e. a constant times $V_X$) independent of $R_1$ and $R_2$.

For negative $V_X$ (see diagram B, FIG. 6) as the ramp $V_r$ passes $V_X$ with positive slope $A\overline{B}$ becomes true permitting partial count accumulation over first interval $T_{1a}$ terminating as $V_r$ passes 0 (i.e. at commencement of $A.\overline{B}$). Then as $V_r$ passes 0 with negative slope, condition $A.\overline{B}$ again becomes true enabling the remainder of the encode count representing $V_X$ to be accumulated over interval $T_{2a}$.

Several observations are in order concerning the circuits of FIG. 5. $V_X$ may be developed either as a ratiometer function of displacement — in which case the absolute level of the comparison references $V_R$, $-V_R$ is not critically important — or as a voltage which is truly referenced to $V_R$ and $-V_R$ in a static circuit configuration. Since the ramp oscillations are bipolar the range of encoding measurement of $V_X$ is bipolar.

The circuit configuration formed by circuits 107, H and L comparators, and FF121 is considered novel and basically useful per se as a source of bipolar ramp oscillation waveform. Although the voltages applied to the integrator and to the high (H) and low (L) comparators are shown in the illustration to be identical this is not generally required. The integrator voltage references may be varied to control the slopes of respective ramp segments (reference relationships 3 and 4 above) and the high, low comparison references may be varied to control the integration times $T_1$, $T_2$. Since the ramp frequency is a function of slope and comparison reference levels, it is seen that independent adjustment of these reference voltages affords a means to separately control slope and frequency of output waveform $V_r$.

While the invention has been particularly shown and described with reference to preferred embodiments thereof, it will be understood by those skilled in the art that various changes in form and details may be made therein without departing from the spirit and scope of the invention.

What is claimed is:

1. An analog voltage to time-based digital count converter comprising:

sources of +, − and null reference voltages;

a source of unknown voltage to be encoded;

a first closed loop circuit for generating a cyclically recurrent bipolar ramp voltage signal having alternate positive and negative slope in each cycle of recurrence; said first closed loop circuit including a high-low comparison section responsive to said ramp and + and − reference voltages for producing a cyclic binary pulse reference signal and an integrating section in tandem with said comparison section for integrating said binary pulse signal to develop said ramp signal;

a second closed loop circuit for continuously generating clock oscillations, at a fixed harmonic of the recurrence frequency of said ramp signal; said second loop including: a voltage controlled clock oscillator, a feedback divider coupled to the output of said oscillator for generating feedback signals, at a fixed subharmonic of the frequence of oscillation of said oscillator and a phase detector responsive to phase differences between said binary pulse reference signals and said feedback signals for producing frequency control signals for constraining said oscillations to said fixed harmonic of the ramp frequency; and means for utilizing said ramp signal relative to said +, −, null and unknown voltages for developing timed gating pulses defining segmental intervals, within successive rise and fall slope phases of a cycle of said ramp signal, having a cumulative time duration within said ramp cycle corresponding to the magnitude of said unknown voltage; said gating pulses being thereby useful for controlling digital counting of said clock oscillations to produce a recurrent digital representation of said unknown voltage, which can be made essentially insensitive to fluctuations in clock oscillator conditions and ramp slope and timing.

2. In an analog voltage encoder subject to all-solid-state packaging and having means for encoding an unknown analog quantity by deriving a time measurement and corresponding digital count representing said quantity, the improvement comprising:

a source of linear bipolar ramp voltage signals alternating cyclically between predetermined positive and negative voltage levels, with predetermined positive and negative slope characteristics in successive time interval segments T1 and T2 of each alternation cycle; wherein the period of the alternation cycle is the sum of T1 and T2, and T1 and T2 are predetermined non-zero and not necessarily equal intervals;

circuit means responsive to said unknown analog quantity and said ramp, during each said interval T1 and T2, for producing binary time selection control signals related to transitional phases of said ramp signals, relative to known references and said quantity, and a frequency control signal used to generate said ramp signals;

a phase locked frequency multiplication circuit controlled by said frequency control signal for continuously generating clock pulse oscillations which are locked in predetermined harmonic frequency relationship with the cyclic frequency of said ramp signal; and selection circuit means responsive to said selection control signals to control repetitive generation of said count representation in each ramp cycle by controlling cumulative counting of said clock pulses for two discrete periods of each said ramp cycle — said discrete periods corresponding to varied time sub-segments of said interval segments T1 and T2 of the cycle during which the ramp is between transitional signal levels representing the unknown analog quantity and a zero reference — and by controlling readout and resetting of said count after the end of the sub-segment in T2 and before the sub-segment in T1 of the following cycle; whereby a count, accurately representative of said analog quantity and insensitive to differences between T1 and T2 in a cycle and to irregularities of circuit components of said ramp and clock oscillation generating circuits, is developed cumulatively over each ramp cycle.

3. An analog to digital converter, in which an analog signal parameter of variable magnitude is represented by a digital count developed over a time interval having a duration related linearly to the variable magnitude, comprising:

a source of cyclically recurrent reference signals having a predetermined cyclically recurrent transitional phase state;

a source of said variable analog parameter presented in a signal form which is cyclically time measurable relative to said reference signals;

a frequency multiplication circuit having a continuously running voltage controlled oscillator in a phase locked loop for producing clock oscillation signals at a predetermined harmonic of the frequency of reference signal recurrence; said circuit including:

a frequency divider receiving said clock oscillations and generating a divided output frequency corresponding to the frequency of recurrence of said reference signals, and a phase discriminator responsive to phase differences between the output of said divider and the reference signals for producing control voltages for constraining said clock oscillations to said predetermined harmonic frequency, regardless of jitter or drift tendencies in said oscillator;

means for utilizing said reference and variable signals to develop variably timed gating signals useful to control repetitive gating of said clock oscillations for development of said digital count representation; said gating signals having short duration by comparison to the length of a reference signal cycle;

said reference and analog signals being causatively unrelated to any motion effect;

said reference signal generating circuit comprising a first circuit for producing cyclically recurrent bipolar ramp signal oscillations having predetermined alternately positive and negative slope in each recurrence cycle, and a second circuit for supplying cyclically recurrent binary pulse reference signals to the first circuit; said first and second circuits being connected in a closed loop; said ramp signals and analog signals being used to develop said gating signals for controlling the development of said digital count and said reference signals being used for controlling said clock oscillation frequency.

* * * * *